United States Patent [19]

Holloway

[11] Patent Number: 5,103,281
[45] Date of Patent: Apr. 7, 1992

[54] MOS-CASCODED BIPOLAR CURRENT SOURCES IN NON-EPITAXIAL STRUCTURE

[76] Inventor: Peter R. Holloway, 7 Stafford La., Andover, Mass. 01810

[21] Appl. No.: 423,265

[22] Filed: Oct. 18, 1989

Related U.S. Application Data

[62] Division of Ser. No. 581,288, Feb. 17, 1984, Pat. No. 4,891,533.

[51] Int. Cl.$^5$ ................... H01L 27/02; H01L 29/72
[52] U.S. Cl. ................................. 357/43; 357/35; 357/41; 357/46
[58] Field of Search .................. 357/43, 23.1, 35, 41, 357/46; 307/303, 570, 296.1

[56]  References Cited

U.S. PATENT DOCUMENTS

| | | | |
|---|---|---|---|
| 3,541,234 | 11/1970 | Austin . | |
| 3,622,812 | 11/1971 | Crawford | 357/43 |
| 3,639,787 | 2/1972 | Lee | 357/43 |
| 4,237,472 | 12/1980 | Hollingsworth . | |
| 4,678,936 | 7/1987 | Holloway | 357/43 |
| 4,891,533 | 1/1990 | Holloway | 357/43 |

OTHER PUBLICATIONS

Electronic Design, vol. 31, No. 22, pp. 44–51.

Primary Examiner—William D. Larkins
Assistant Examiner—Ngan Van Ngo
Attorney, Agent, or Firm—Parmelee, Bollinger & Bramblett

[57]  ABSTRACT

A 16-bit D/A converter formed on a single monolithic chip and having two cascaded stages each including a 256-R resistor string DAC. The analog output voltage of the first stage is coupled to the second stage by two buffer amplifiers each formed by a non-epitaxial process using a P-type substrate. The amplifiers include NMOS and PMOS-cascaded bipolar current sources arranged to avoid the use of metallization to provide for electrical interconnections within the source.

5 Claims, 3 Drawing Sheets

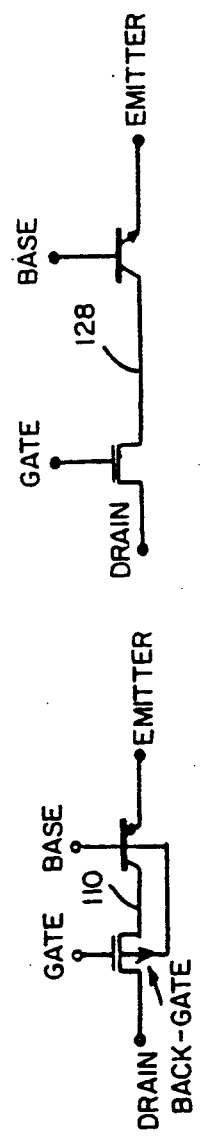
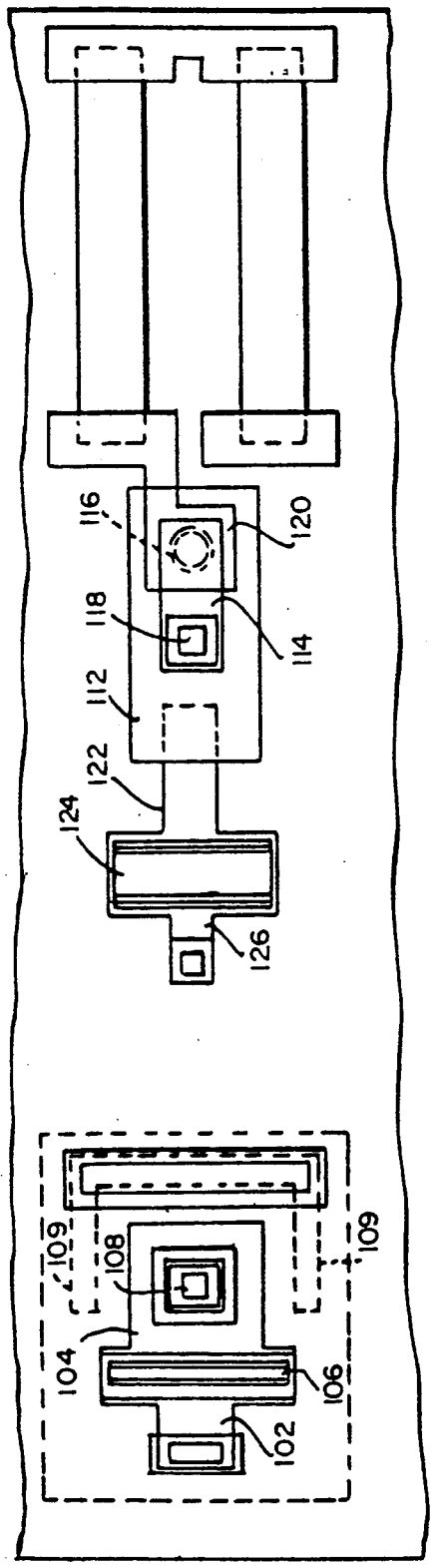
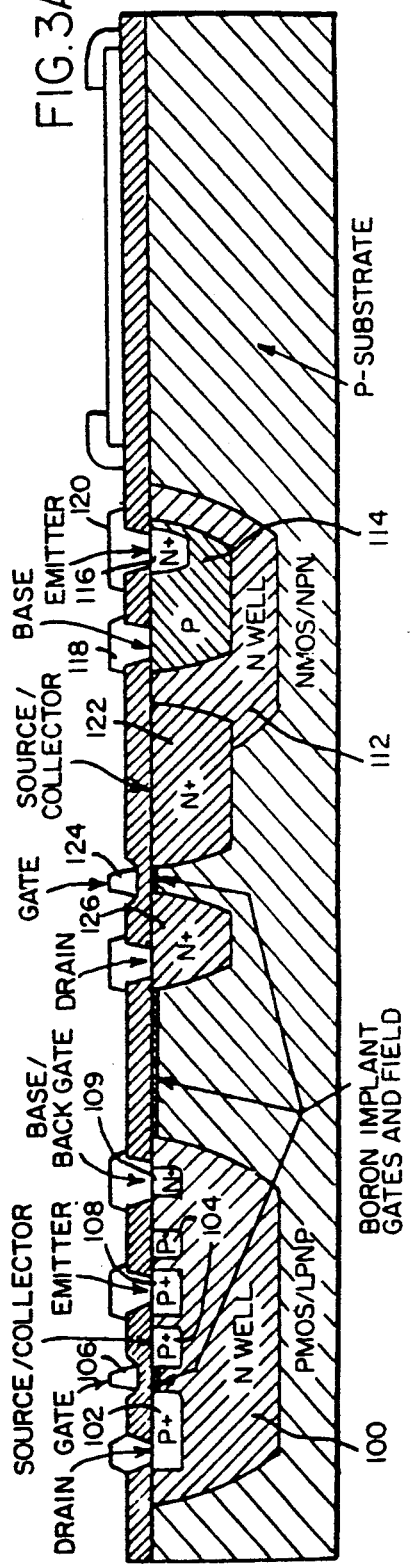

MOS-CASCODED BIPOLAR CURRENT SOURCES IN NON-EPITAXIAL STRUCTURE

This application is a division of Ser. No. 581,288 as filed on Feb. 17, 1984, now U.S. Pat. No. 4,891,533 issued Jan. 2, 1990.

BACKGROUND OF THE INVENTION

1. Field of the Invention

This invention relates to current sources formed on an integrated-circuit (IC) chip. More particularly, this invention relates to MOS-cascoded bipolar current sources such as may be used as part of a high-performance amplifier circuit. The invention is described herein for use in amplifiers employed in a cascaded two-stage D/A converter.

2. Description of the Prior Art

Susset U.S. Pat. No. 3,997,892 shows a two-stage cascaded D/A converter wherein the first stage includes a resistor-string DAC to produce a first segment voltage corresponding to a set of higher-order input bits. That voltage is directed through buffer amplifiers to the second stage converter which interpolates the selected first-stage segment voltage in accordance with the lower-order bits.

For such a converter to perform successfully at high resolutions, such as 16-bits, the inter-stage buffer amplifiers must meet extremely stringent specifications. It has been found that such specifications cannot be achieved using known techniques.

SUMMARY OF THE INVENTION

An IC amplifier design is provided utilizing uniquely-configured MOS-bipolar current sources which significantly enhance the performance of the amplifier. These current source structures are formed using an N-well non-epitaxial IC process, and advantageously make possible inter-connections within the current source without the need for bridging metallization. Although the current sources are disclosed in an amplifier implementation, such current sources can find application in other types of integrated circuits.

Still other objects, aspects and advantages of the invention will in part be pointed out in, and in part apparent from, the following description of a preferred embodiment considered together with the accompanying drawings.

BRIEF DESCRIPTION OF THE DRAWINGS

FIGS. 3A, 3B and 3C show details of N-type and P-type MOS-cascoded bipolar current sources formed with a non-epitaxial process, and adapted for use in the amplifier of FIG. 2.

DETAILED DESCRIPTION OF A PREFERRED EMBODIMENT

Figure 1:
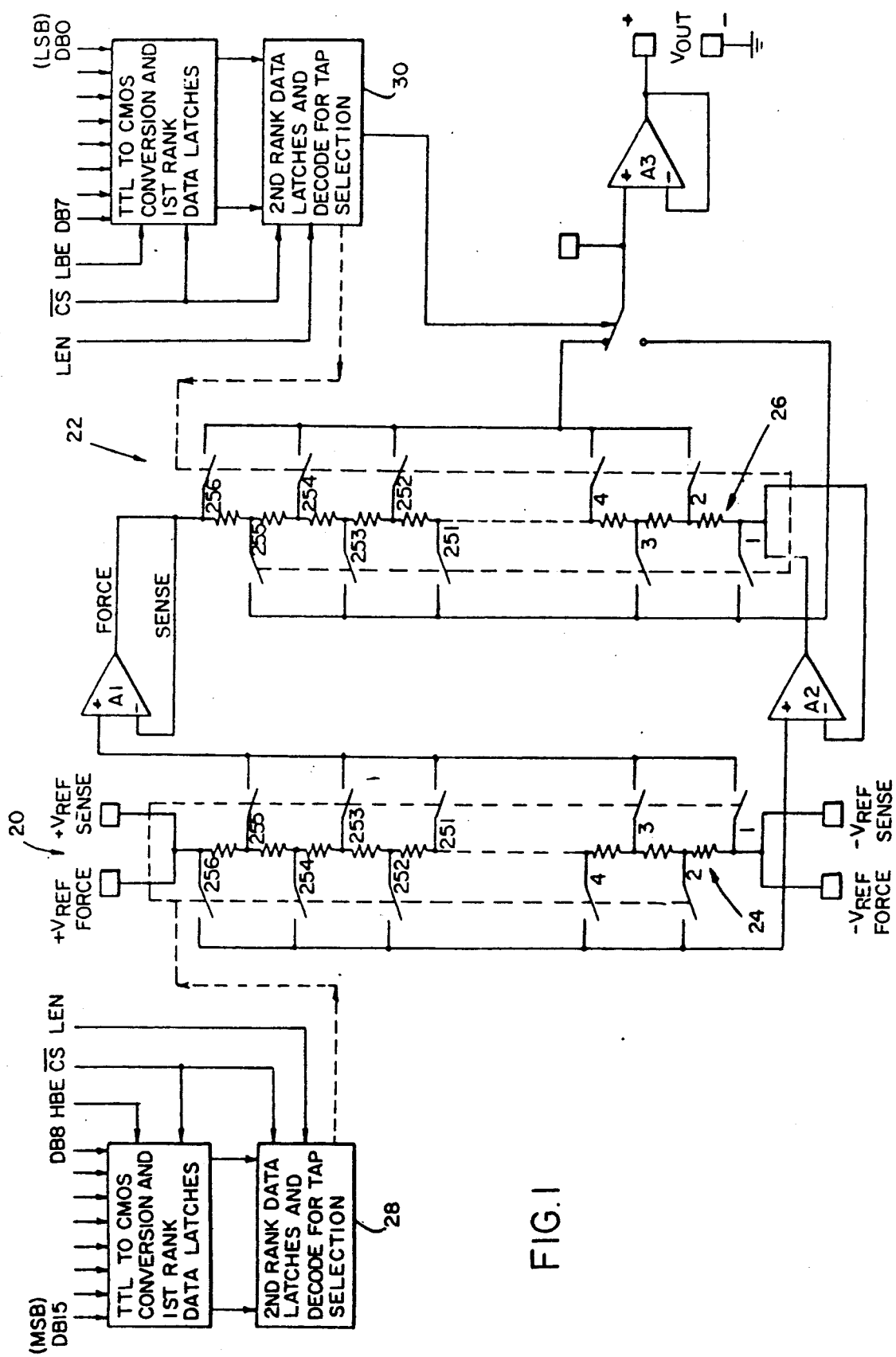
FIG. 1 is a simplified diagrammatic showing of a two-stage cascaded D/A converter.

Referring first to FIG. 1, which is a simplified diagram of a 16-bit D/A converter, it will be seen that the device includes two cascaded stages generally indicated at 20 and 22. Each stage comprises a 256-R resistor string 24, 26. Logic circuitry 28, 30 of known type of design is used to develop the switch control signals for the respective stages. Buffer amplifier $A_1$, $A_2$ are employed to direct the first-stage segment output voltage to the second stage where it is applied to the ends of the resistor string 26.

The first stage resistor string 24 receives a voltage shown as $+V_{REF}$ AND $-V_{REF}$. That voltage is divided by the resistor string into 256 nominally equal voltage segments. Any two adjacent voltage taps are selected in accordance with the upper byte (8 bits) of the 16-bit input word. Amplifier $A_1$ transfers the voltage of one selected tap (e.g. tap 251) to the top of the second stage. Amplifier $A_2$ transfers the voltage from an immediately adjacent tap (e.g. tap 252) to the bottom of the second stage. The output amplifier $A_3$ produces a signal linearly interpolating the voltage drop between taps 251 and 252, weighted by the lower byte of the 16-bit input word.

Details of the switch selector system and the associated resistor string for this converter are disclosed in copending application Ser. No. 581,133, filed by the present applicant on Feb. 17, 1986, now U.S. Pat. No. 4,543,560.

Figure 2:
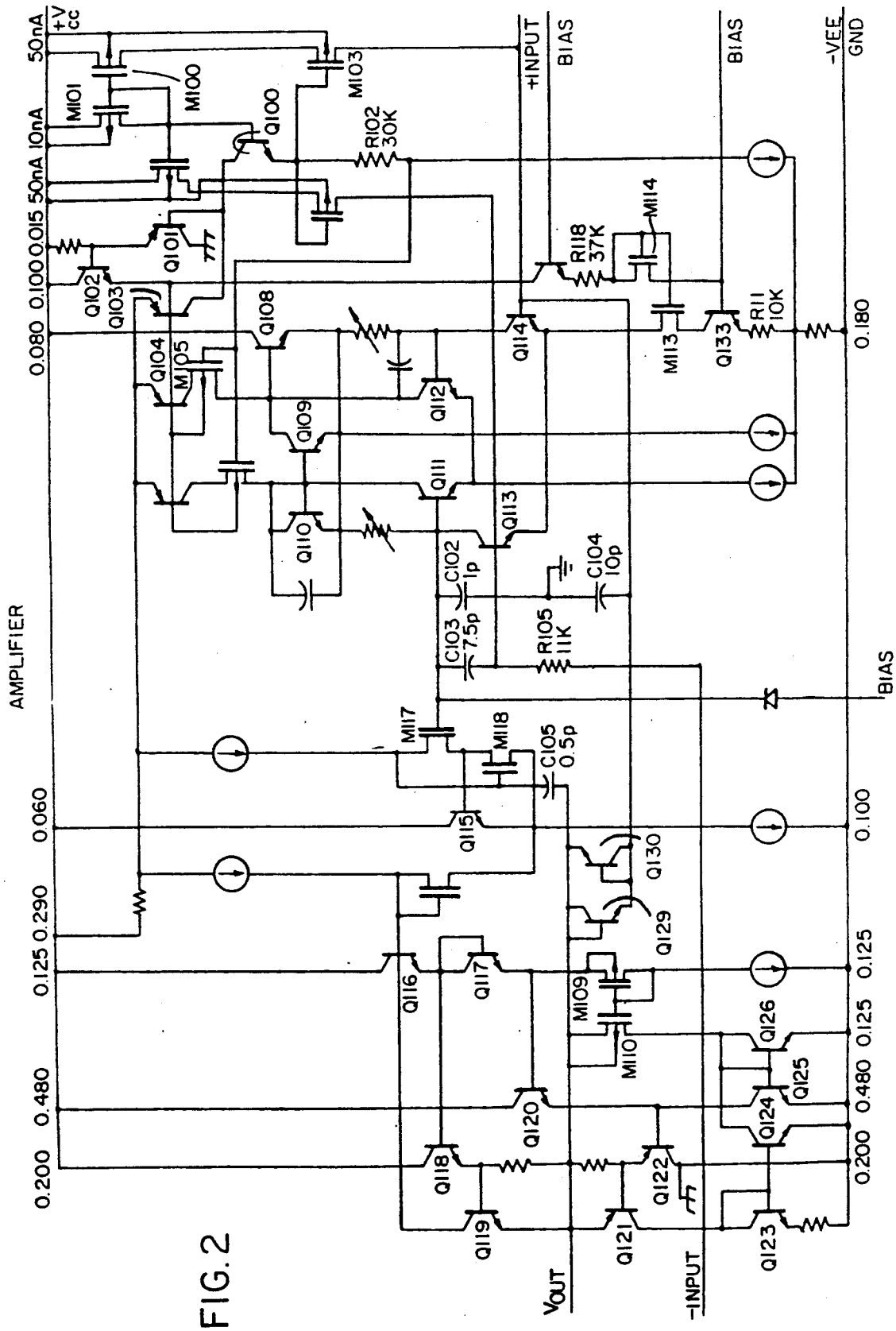
FIG. 2 is a circuit diagram of an amplifier used in the converter of FIG. 1.

FIG. 2 shows a simplified circuit diagram of an amplifier suitable for use as amplifiers $A_1$, $A_2$ and $A_3$. These amplifiers were specified to settle to 16 bits in 3 $\mu$s and simultaneously be high precision dc op-amps. The amplifier includes a single differential gain stage $Q_{113}$, $Q_{114}$, which uses an immittance inverter $Q_{108-112}$ as a load, followed by an MOS/bipolar unity gain impedance buffer. This dominant pole compensated amplifier achieves an $A_{VOL}$ of $10^6$ through the use of bootstrapping. This minimizes the signal dependent $V_{CB}$ modulation in $Q_{113,114}$ and raises the differential load impedance of the gain stage by a factor equal to the loop gain of the amplifier formed by $Q_{108-112}$, and, finally, linearizes the MOS/bipolar unity gain buffer by making $V_{DS}$ track between $M_{117}$ and $M_{119}$.

To preserve open loop gain, all current sources (shown as an arrow-in-a-circle) are MOS-cascoded bipolar structures. Details of one such current source are shown at $M_{113}$ and $Q_{133}$. The resulting impedance enhancement afforded by the reverse voltage transfer ratio of the FET permits an Early voltage of $10^6$ volts to be achieved at the drain of $M_{113}$. Similarly, $Q_{104}$ and $M_{105}$ provide the same advantage for sources originating from the positive supply, side-stepping the inherently low impedance of the split vertical/lateral PNP's which are unavoidable device problems in a non-epitaxial process. $I_b$ compensation is provided by a PMOS current reflector, operating in subthreshold, shown in part by $M_{101-103}$ and $Q_{100}$. The Darlington NPN/vertical output stage has an $I_b$ booster for the output VPNP, $Q_{122}$. $M_{109,110}$ in conjunction with $Q_{125,126}$ boosts the base drive into the output when $V_{out}$ lags the voltage at the emitter of $Q_{117}$ under negative slew. The amplifier occupies 1500 mil$^2$ and settles to 10 ppm in 3 $\mu$s.

The configuration of such P-type and N-type MOS-cascoded bipolar current sources are shown in FIGS. 3A and 3B, representing the cross-section and plan views respectively of the devices. FIG. 3C shows the electrical circuit representation of each device, approximately aligned with the corresponding elements of FIGS. 3A and 3B.

Referring now to the left-hand portion of FIGS. 3A and 3B, the non-epitaxial P-type substrate is doped to form the usual N-well 100. At the left end of the N-well is a first P-type diffusion 102 of generally rectilinear outline which serves as the drain of a PMOS device. The source of this device is formed by a second P-type diffusion 104 having its principal portion arranged as a square-shaped ring. The PMOS gate 106 is positioned between the source and drain.

Within the square ring of diffusion 104 is another P-type diffusion 108 which serves as the emitter of a lateral PNP transistor. The N-type material of the N-well serves as the base of this transistor, and connection is made to the base by an N+ diffusion 109 of generally U-shape and extending partially around the square-ring P-type diffusion 104. The collector of the LPNP is diffusion 104, shared as above by the PMOS source. Thus it will be seen that this diffusion serves as both the collector of the LPNP and the source of the PMOS device.

Since both of these functions are performed by the same diffusion, the PMOS source and the PNP collector are effectively connected together electrically, without any need for bridging metallization. That is, no additional layer of metal has to be added to the substrate to make this connection, which is illustrated in the circuit diagram of FIG. 3C at 110.

No electrode is provided for the P-type diffusion 104, since no external connection is needed to be made to the source/collector of the MOS-bipolar current source. Electrodes are provided for the PMOS drain and for the base and emitter of the LPNP transistor.

A distinct characteristic of the PMOS-bipolar current source is that the entire circuit is integrated into a single N-well, which affords important benefits in carrying out the process.

Turning now to the right-hand portion of FIGS. 3A and 3B, there is shown another N-well diffusion 112 within which is a P-type diffusion 114 containing another N-type diffusion 116. These three elements function respectively as the collector, base and emitter of an NPN transistor. Base and emitter electrodes 118, 120 are formed above the substrate to make the necessary connections.

The N-well 112 is effectively extended laterally by means of an N+ diffusion 122 which overlaps the initial N-type diffusion. The N+ diffusion reaches to a region alongside a gate electrode 124, and a further N+ diffusion 126 is made on the other side of the gate. This latter diffusion serves as the drain of an NMOS device. The source of this device is formed by the N-type material with the N-well 112.

Thus, it will be seen that the N-well 112 (which in this embodiment includes extension 122) serves as both the source of an NMOS device and the collector of an NPN transistor. Accordingly, these two elements are effectively electrically connected, as indicated at 128 in FIG. 3C, without the need for a metallization layer. The inclusion of diffusion 122, a low resistivity source-drain diffusion comparable to that routinely used in N-MOS and CMOS fabrication, is to enhance the performance of the composite structure through the reduction of the ohmic resistance diagrammatically represented as path 128 in FIG. 3C. The operation of this invention is otherwise unaffected by the omission of 122.

Although a preferred embodiment of this invention has been described hereinabove in detail, it is desired to emplhasize that this has been for the purpose of illustrating the invention, and should not be considered as necessarily limitative of the invention, it being understood that many modifications can be made by those skilled in the art while still practicing the invention claimed herein.

What is claimed is:

1. In a monolithic integrated circuit formed on a substrate and including a large number of circuit elements at least one of which requires a flow of current of stably fixed magnitude, said integrated circuit further comprising an MOS-cascoded bipolar current source connected in series with said one circuit element with the series combination connected between positive and negative supply rails, said current source furnishing current of precisely fixed value to said element and including:

first and second regions of one conductivity type diffused in said substrate to serve as the drain and the source of an MOS device;

a gate positioned between said first and second diffused regions;

a third region of said one conductivity type diffused in said substrate separate from said first and second regions, said third diffused region serving as the emitter of a bipolar transistor;

a fourth region of a conductivity type opposite said one conductivity type diffused in said substrate between said second and third diffused regions to serve as the base of said bipolar transistor;

said second diffused region serving as the collector of said bipolar transistor as well as serving as the source of said MOS device, whereby said MOS device and said bipolar transistor are connected in series; and means to bias said gate of said MOS device and said base of said bipolar transistor to provide for effective cascode operation thereof together in said series configuration.

2. In a monolithic integrated circuit as in claim 1, wherein said substrate is P-type and free of any epitaxial layer.

3. In a monolithic integrated circuit as in claim 1, including an N-well diffused in said substrate to serve as one of said diffused regions and containing at least one other of said diffused regions, said one other region being of P-type.

4. In a monolithic integrated circuit as in claim 3, wherein said first, second and third regions are P-type and are diffused in said N-well.

5. In a monolithic integrated circuit as in claim 3, wherein said first and second regions are N-type;
said N-well comprising said second region;
said fourth region being of P-type and wholly located within said N-well;
said third region being of N-type and wholly located within said fourth region.

* * * * *

UNITED STATES PATENT AND TRADEMARK OFFICE
CERTIFICATE OF CORRECTION

PATENT NO. : 5,103,281
DATED : April 7, 1992
INVENTOR(S) : Peter R. Holloway

It is certified that error appears in the above-indentified patent and that said Letters Patent is hereby corrected as shown below:

On the Title page, under item [73], insert Notice: The portion of the term of this patent subsequent to July 7, 2004 has been disclaimed--.

Signed and Sealed this

Fifteenth Day of June, 1993

Attest:

MICHAEL K. KIRK

Attesting Officer

Acting Commissioner of Patents and Trademarks